United States Patent
Davis et al.

(10) Patent No.: US 10,734,967 B2
(45) Date of Patent: Aug. 4, 2020

(54) CAPACITOR COMPENSATED DUAL OF POLYPHASE FILTER

(71) Applicant: Intel Corporation, Santa Clara, CA (US)

(72) Inventors: Brandon Davis, Phoenix, AZ (US); Aishwarya Balakrishnan, Tempe, AZ (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/146,095

(22) Filed: Sep. 28, 2018

(65) Prior Publication Data

US 2020/0106413 A1 Apr. 2, 2020

(51) Int. Cl.
*H03H 7/21* (2006.01)
*H03H 7/06* (2006.01)
*H03H 7/01* (2006.01)

(52) U.S. Cl.
CPC ............. *H03H 7/21* (2013.01); *H03H 7/06* (2013.01); *H03H 2007/0192* (2013.01)

(58) Field of Classification Search
CPC combination set(s) only.
See application file for complete search history.

(56) References Cited

U.S. PATENT DOCUMENTS

| | | | |
|---|---|---|---|
| 7,095,801 B1 | 8/2006 | Magoon et al. | |
| 8,412,141 B2 | 4/2013 | Savoj | |
| 9,252,743 B2 | 2/2016 | Song | |
| 9,281,888 B1 | 3/2016 | Mu | |
| 10,389,572 B2 * | 8/2019 | Mao | H04B 1/30 |
| 2001/0038323 A1 | 11/2001 | Christensen | |
| 2006/0003717 A1 * | 1/2006 | Sowlati | H03D 7/1433 455/168.1 |

(Continued)

FOREIGN PATENT DOCUMENTS

JP H08130431 A 5/1996

OTHER PUBLICATIONS

Harris, Fredric J. et al. "Digital Receivers and Transmitters Using Polyphase Filter Banks for Wireless Communications." IEEE Transactions on Microwave Theory and Techniques, vol. 51, No. 4, Apr. 2003. 18 pages.

(Continued)

*Primary Examiner* — Junpeng Chen
(74) *Attorney, Agent, or Firm* — Eschweiler & Potashnik, LLC

(57) ABSTRACT

A polyphase filter operates to provide capacitive compensation to drive a multiphase network for generating quadrature signals. The polyphase filter can include a capacitive compensation mechanism at internal nodes. The capacitive compensation mechanism includes a first phase lag circuit between a first internal node and a second internal node and a second phase lag circuit coupled between a third internal node and a fourth internal node. The first internal node is coupled to the second internal node via a first inductor coupled to a first resistor, the second internal node is coupled to the third internal node via a second inductor coupled to a second resistor, the third internal node is coupled to the fourth internal node via a third inductor coupled to a third resistor, and the fourth internal node is coupled to the first internal node via a fourth inductor coupled to a fourth resistor.

21 Claims, 9 Drawing Sheets

(56) References Cited

U.S. PATENT DOCUMENTS

| | | | | |
|---|---|---|---|---|
| 2008/0030244 | A1* | 2/2008 | Leifso | H03B 19/14 |
| | | | | 327/122 |
| 2011/0092169 | A1* | 4/2011 | Savoj | H03H 7/21 |
| | | | | 455/73 |
| 2014/0176259 | A1* | 6/2014 | Reynaert | H03H 7/06 |
| | | | | 333/172 |
| 2016/0065179 | A1* | 3/2016 | Taghivand | H03H 11/1204 |
| | | | | 327/554 |

OTHER PUBLICATIONS

Mohsenpour, Mohammad-Mahdi et al. "Variable 360° C. Vector-Sum Phase Shifter with Coarse and Fine Vector Scaling." IEEE Transactions on Microwave Theory and Techniques. 8 pages.

International Search Report and Written Opinion dated Dec. 13, 2019 for PCT Application PCT/US2019/048496.

Fujiwara, Takanobu et al. "Broadband and Highly Accurate X-Band Vector-Sum Phase Shifter Using LC-Type Power Splitter." Proceedings of the 13th European Microwave Integrated Circuits Conference. Sep. 24-25, 2018, Madrid, Spain.

* cited by examiner

US 10,734,967 B2

CAPACITOR COMPENSATED DUAL OF POLYPHASE FILTER

FIELD

The present disclosure relates to a polyphase filter, and more specifically, a capacitor compensated dual of the polyphase filter.

BACKGROUND

Adaptive radios capable of dynamically trading off energy for signal-to-noise ratio (SNR) slack can enable significant power savings, but developing a fully reconfigurable analog front-end, which achieves suitable performance in digital-optimized process technology presents a major challenge to building low-power adaptive radios. Two of the major functions of an analog receiver front-end-blocker include rejection filtering and low-noise amplification for digital CMOS processes. However, a challenge remains to implement these functions while reducing manufacturing cost and leveraging the advantages of high-speed process technologies.

In one example, there is ongoing interests in improving resolution and accuracy of microwave circuit phase shifters. This is further motivated by the role of phase shifters covering 360 degrees and maintaining a small footprint area of chips while using different technologies, including delay lines, signal reflection, high pass/low-pass networks, all-pass networks, or vector summation as with vector-sum phase shifters.

DETAILED DESCRIPTION

Figure 1:
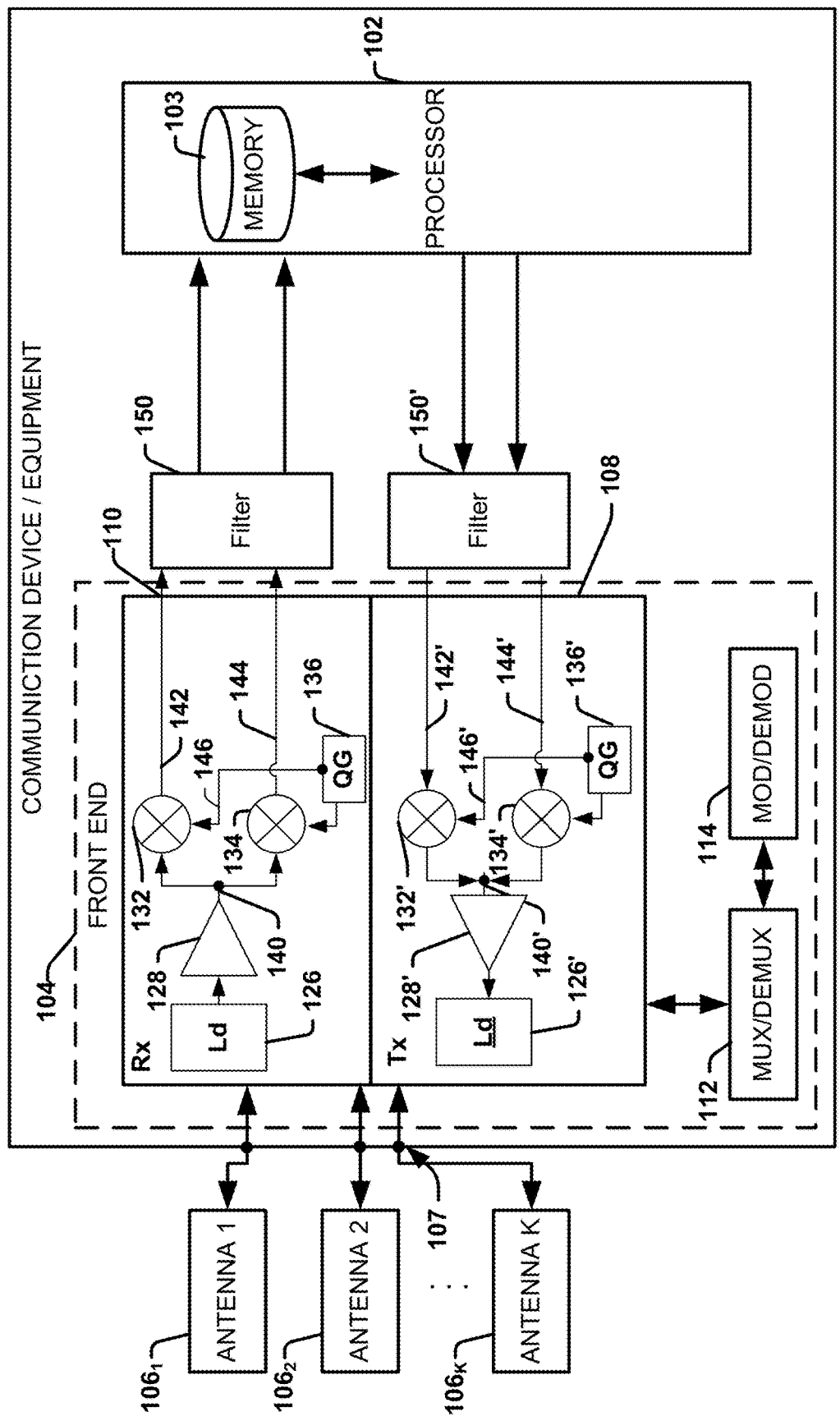
FIG. 1 is example architecture of mobile device, or communication equipment for a polyphase filtering implementing various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, a programmable processing circuit, a programmable array, and/or a computer with a processing device. By way of illustration, an application running on a server and the server can also be a component. One or more components can reside within a process, and a component can be localized on one computer and/or distributed between two or more computers.

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components. As used herein, a mechanism can be one or more components, such as a capacitor compensation mechanism/component, for example, the mechanism/component is intended to denote a structure as a mechanism or component modified by a capacitor, a compensation, or both a capacitor and a compensation, for example.

A set of elements or a set of other components can be described herein, in which the term "set" can be interpreted as "one or more." In addition, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies, various embodiments are described herein to provide a quadrature generation circuit or a polyphase filter to perform polyphase filtering with an output impedance that is inductive and negates the demand for additional matching networks, such as for driving CMOS loads or other applications (e.g., vector-sum phase shifting, millimeter wave (mmW) communication, or the like). As such, a polyphase filter/ network/circuit/component can integrate a capacitive compensation mechanisms in order to meet these demands while being robust or insensitive to different loads or loading changes at the same time. Better IQ performance results for a given area and power constraints in comparison to other passive quadrature generation circuits/networks can be realized by various aspects/embodiments of capacitive compensated polyphase networks (filters, circuits, etc.) disclosed herein.

In an aspect, a mobile device, communication device or other device can include an antenna port operably connected to an antenna for receiving, processing, transmitting, generating signals within a frequency band (e.g., a millimeter wave (mmW) band from 30 GHz to 300 GHz, or up to 1 Terahertz, or other bandwidth). A radio-frequency (RF) frontend can be coupled to the antenna port and a signal processing chain for processing signals for transmission or reception. The signal processing chain can include an in-phase path configured to provide in-phase signals and a quadrature path configured to provide a quadrature signals. A quadrature signal generator, coupled to the in-phase path and the quadrature path, can include a capacitor compensated polyphase network, coupled to a local oscillator (LO), configured to receive a differential input signal (from the LO) and provide a first differential output signal and a second differential output signal for the signal processing chain, by providing or utilizing a capacitive compensation mechanism at internal nodes of the capacitor compensated polyphase network.

By adding capacitive compensation to a dual of a polyphase network that filters and generates differential signals for quadrature generation, a resistance to load changes and improved in-phase/quadrature (IQ) characteristics or performance can be realized. As an example, IQ performance can refer to amplitude imbalance as well as phase imbalance of an output of the capacitor compensated polyphase network. An ideal phase difference is approximately 90 degrees, while an ideal IQ amplitude imbalance is zero, for example.

By using the dual stages/phases of a polyphase network, where capacitor compensation is provided at different stages/paths of the polyphase filter, the output impedance can be configured to be inductive and more stable between different driving of different loads at the same time. Modifying the polyphase filter network with one or more additional capacitive components or elements, provides a network with selected values that generates a balanced output load across any load change. In this case a balanced output implies that the complex impedance looking into an in-phase (I) output is equal to, or nearly equal to, a quadrature (Q) output.

Further, the capacitive compensated polyphase network/circuit/filter can be configured with out-of-phase coupling of the anti-phase coils, thus enabling a more compact physical design of the network. This can further facilitate to generate filtered outputs as a simultaneous I/Q generation and power matching while maintaining I/Q balance over load changes (due to effects such as process, temperature, etc.). Consequently, the capacitive compensated polyphase network can be configured without additional spiral type matching element to optimally drive CMOS loads when implementing a passive quadrature signal generation network (circuit, component, filter, etc.).

Additional aspects and details of the disclosure are further described below with reference to figures.

Referring to FIG. 1, illustrated is an exemplary user equipment, mobile communication device or system 100 that can be utilized with a quadrature signal generator or vector-sum phase shifter comprising a polyphase filter according to various aspects. The mobile communication device 100, for example, comprises a digital baseband processor 102 that can be coupled to a data store or memory 103, an RF front end 104 and a set (one or more) of antenna ports 107 for connecting to a set of antennas $106_1$ to $106_k$ (k being a positive integer), which can receive and transmit signals via one or more wireless devices (e.g., access point(s), access terminal(s), wireless port(s), router(s) and so forth, which can also operate within a radio access network or other communication network over the air interface.

The front end 104 can be a radio frequency (RF) front end and include a communication platform with an I/Q modulator structure, which comprises electronic components or associated circuitry that provide for processing, manipulation, shaping, or filtering of signals transmitted or received via the transmitter 108 or receiver 110, a mux/demux component 112, and a mod/demod component 114. The front end 104 can be coupled to the digital baseband processor 102 and the antenna ports 107. The set of antennas $106_1$ to $106_k$ can be part of the front end.

The transmitter/receiver 108, 110 can operate in one aspect as a low-intermediate frequency (low-IF) receiver/transmitter 108, 110, as well as for processing and quadrature generation in high band antenna systems as well as micro millimeter wave communications among one or more internal or external components. The front end 104 can include the following components: an antenna 106, a load, matching network, or RF unit 126, 126', an amplifier (e.g., a low noise amplifier in the receiver path 110, a power amplifier in the transmitter path 108, or the like) 128, 128', a quadrature signal generator (QG) 136, 136' and two mixers (132, 134; 132', 134'). Additional components can also be coupled to, or a part of, the front end 104, along signal processing paths 142, 144, or 142', 144' of receiver 110, or transmitter 108, respectively.

The antenna 106 can receive RF modulated signals transmitted by a base station or other transmitter and provide a received RF signal that is provided to RF unit 126 and to receiver 110. Conversely, baseband processor 102 processes data to be transmitted and provides I and Q baseband output signals to transmitter 108, which then can amplify, filter and further obtain I and Q signals, respectively, to upconvert from baseband to RF via (with/by/thru) mixers 132', 134', for example. RF unit 126, 126' can include RF filters or other circuits, be separate or a same component.

During operation at the receiver and transmitter, the amplifier 128, 128' can provide modulated IQ data received from any one of antennas 106 to the first and second mixers 132, 134, or 132', 134', respectively. In essence, the first and second mixers 132, 134, 132', 134', respectively, perform signal multiplication and either down-convert or up-convert the amplified IQ data signal 140 between a received frequency and an intermediate frequency (IF), depending on the receive path or transmit paths, respectively. The first mixer 132, for example, converts the received IQ data signal 140 to an in-phase signal (I) 142 at an intermediate frequency (IF), for example, while the second mixer 134 converts the amplified IQ data signal 140 to a quadrature signal (Q) 144 at IF. The reverse can be true with respect to mixers 132' and 134' of the transmitter path 108 can upconvert I/Q signals to RF. More specifically, the first mixer 132, 132' mixes the amplified IQ data signal 140 with an in-phase local oscillator (LO) signal 126 to provide for the in-phase (I) signal 142. The second mixer 134, 134' mixes the amplified IQ data signal 140 with a phase-shifted LO signal 128 to provide for the Q-signal 144.

In various embodiments the receiver 110 could utilize low-side injection (e.g., where IF=FREQ−LO) as well as high-side injection (e.g., where IF=LO−FREQ). In other embodiments, the receiver 110 could have multiple IFs, where separate stages step down the frequency from one IF to the next IF, for example, and conversely upconvert or step up in the transmitter path 108.

An optional filtering block 150, 150' can filter the I-signals 142, 142' and Q-signal 144, 144' to provide first and second filtered signals respectively, in which unwanted image signals have been removed. In some embodiments, the filtering block 150, 150' could be a complex polyphase filter as also detailed further in one or more embodiments or aspects described herein.

The baseband processor 102 can be configured to generate control signals for various circuit components such as the quadrature signal generator 136, 136', filtering block 150, 150' or other components. The memory 103 can be operably coupled as internal or external to the baseband processor 102. Baseband processor 102 can also be implemented on one or more application specific integrated circuits (ASICs) or other integrated circuits.

In an embodiment, the quadrature signal generator 136, 136' or filtering block 150, 150' can comprise an inductor-resistor (LR) polyphase filer including the capacitive compensated polyphase network used to generate local oscillator signals for frequency downconversion or upconversion. The LR polyphase filter can receive an input signal from an oscillator and can provide output signals that are in quadrature of one another. The LR polyphase filter can be configured to operate at high frequency and can have other desirable characteristics, as described below.

Figure 2:
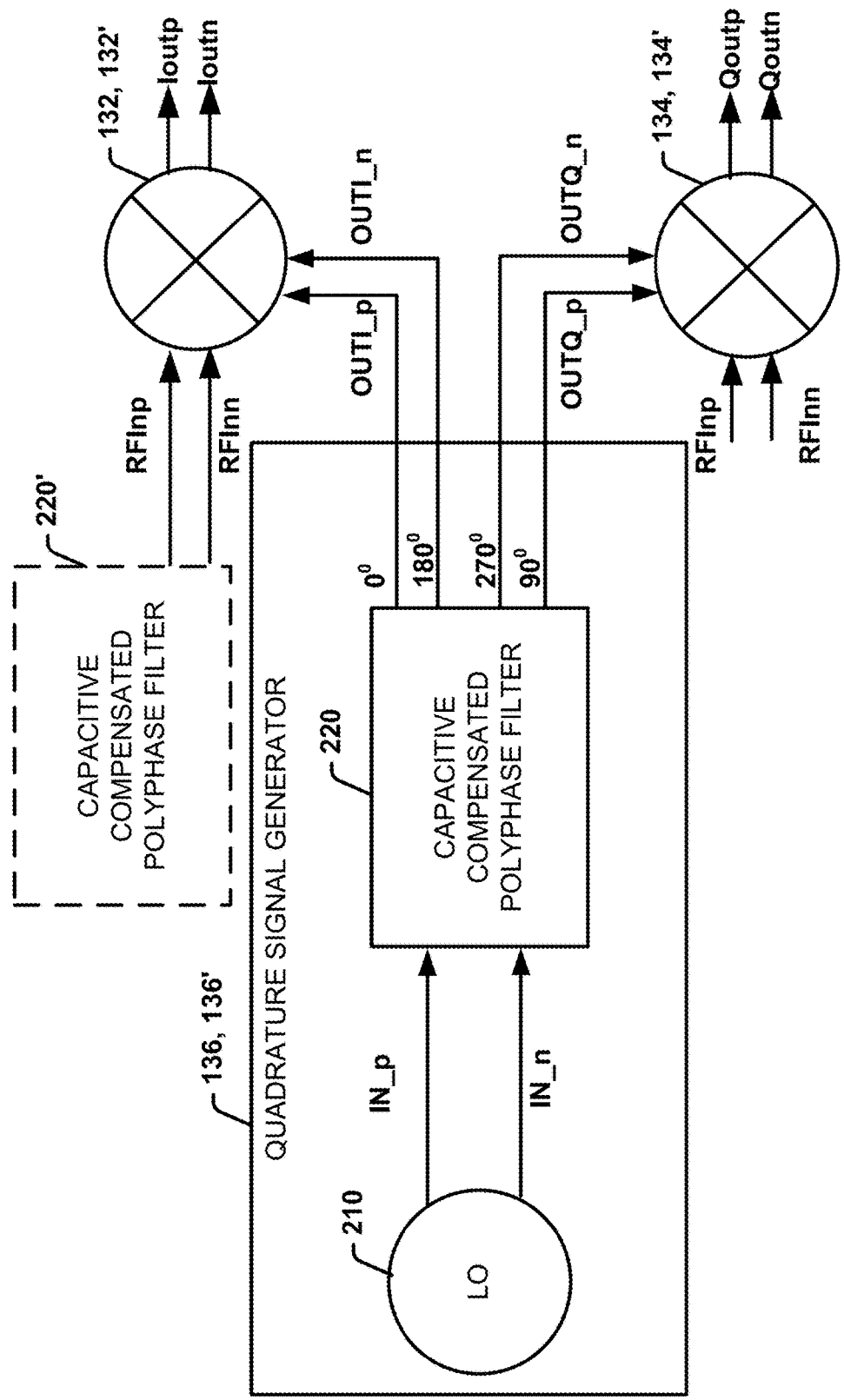
FIG. 2 is an example of a quadrature signal generator in accordance with various aspects described.

FIG. 2 illustrates an example embodiment of a capacitive compensated polyphase filter implemented in the quadrature signal generator 136, 136' of FIG. 1. The quadrature signal generator 136, 136' comprises a local oscillator (LO) 210 that provides a differential input signal to a capacitive compensated polyphase network 220. Each component can receive one or more differential input signals and provides one or more differential output signals. Each differential signal comprises a noninverting signal (denoted by postfix "p") and an inverting signal (denoted by postfix "n"). A circuit component (e.g., a mixer) can receive single-ended or different inputs and can provide single-ended or different outputs.

Although the capacitive compensated polyphase network 220 is illustrated as receiving an LO signal from LO 210 at inputs to the capacitive compensated polyphase network 220 for quadrature signal generation at outputs, the capacitive compensated polyphase network 220 can also be utilized as providing an output to a different RF input (not shown) of the mixers 132, 132', 134, 134' as illustrated for example at the filter 220'. In this manner, the capacitive compensated polyphase network 220 can alternatively be configured as a hybrid coupler to the mixers 132, 132', 134, 134'

For example, alternatively or additionally, the RF signal can be converted to an RF I and an RF Q by a separate and other capacitive compensated polyphase network 220' connected to the RFInn and RFinp inputs of mixers 132, 132', 134, 134' along the path from node 140 of FIG. 1, and this output could then be provided to the mixers at the RF inputs (in one case the LO could be only one phase and the RF be in two phases). Then in an even less commonly seen option is to provide RF I/Q inputs and LO I/Q inputs to a mixer (which could ease the I/Q generation amplitude and phase requirements in some cases).

Mixers 132, 132' downconvert a differential input RF signal comprising RFinp and RFinn signals with the differential I LO signal and provides a differential I downconverted signal comprising Ioutp and Ioutn signals. Mixers 134, 134' downconverts the differential input RF signal with the differential Q LO signal and provides a differential Q downconverted signal comprising Qoutp and Qoutn signals.

Within signal generator 136, a LO 210 can provide a differential VCO signal comprising IN_p and IN_n signals, for example. LO 210 can operate at high frequency, e.g., near 60 GHz for IEEE 802.11 VHT or some other frequency such as mmW from 30 GHz to 300 GHz, or up to 1 THz. A capacitive compensated polyphase filter 220 can receive a differential input signal and provide (i) a differential I signal comprising OUTI_p and OUTI_n signals and (ii) a differential Q signal comprising OUTQ_p and OUTQ_n signals. The OUTQ_p signal can be 90° out of phase with respect to the OUTI_p signal. Mixer 132, 132' downconverts a differential input radio frequency RF signal comprising RF p and RF n signals as positive (p) and negative (n) with the differential I signal and provide a differential I downconverted signal comprising OUTI_p and OUTI_n signals of 180 degrees. Mixer 134, 134' downconverts the differential input RF signal with the differential Q signal and provides a differential Q downconverted signal comprising OUTQ_p and OUTQ_n signals.

The signal generator 136, which can also be implemented in other manners such as an LO signal generator, a quadrature signal generator, a phase shifter, a vector-sum phase shifter, or the like. In one example, LO 210 can be replaced with a voltage controlled oscillator, a current controlled oscillator (I CO), a digitally controlled oscillator (DCO), or other oscillator configurations. Signal generator 136' for transmitter 108 of FIG. 1, for example, can be implemented in similar manner as signal generator 136 for receiver 110. For a frequency division duplexed (FDD) system, different frequency channels can be used for the downlink and uplink. In this case, wireless device 100 can transmit and receive concurrently, and separate signal generators 136 and 136' can be used to concurrently generate LO signals for receiver 110 and transmitter 108. For a time division duplexed (TDD) system, the same frequency channel can be used for both the downlink and uplink, which can be allocated different time intervals. In this case, wireless device 100 can either transmit or receive at any given moment, and a single signal generator 136 or 136' can generate LO signals for both receiver 110 and transmitter 108.

In other embodiments, the LO 210 can be a coupler of a microwave integrated circuit phase shifter that operates as a 180 degree power splitter that converts an RF input voltage signal into a differential waveform across IN_p and IN_n, for example. The quadrature signal generator can then generate four equal amplitude orthogonal voltage signal vectors, for I and Q paths (e.g., 142, 144). As such, a vector-sum phase shifter can utilize these outputs by scaling the four voltage signals (e.g., via operational transconductance amplifiers, or the like), and further converting them to current signals, for example. The different signals can then be selectively summed along vector paths to produce a desired output phase angle, such as by coarse grain components and fine grain components controlled by one or more control bits from the processor 102, for example.

Figure 3:
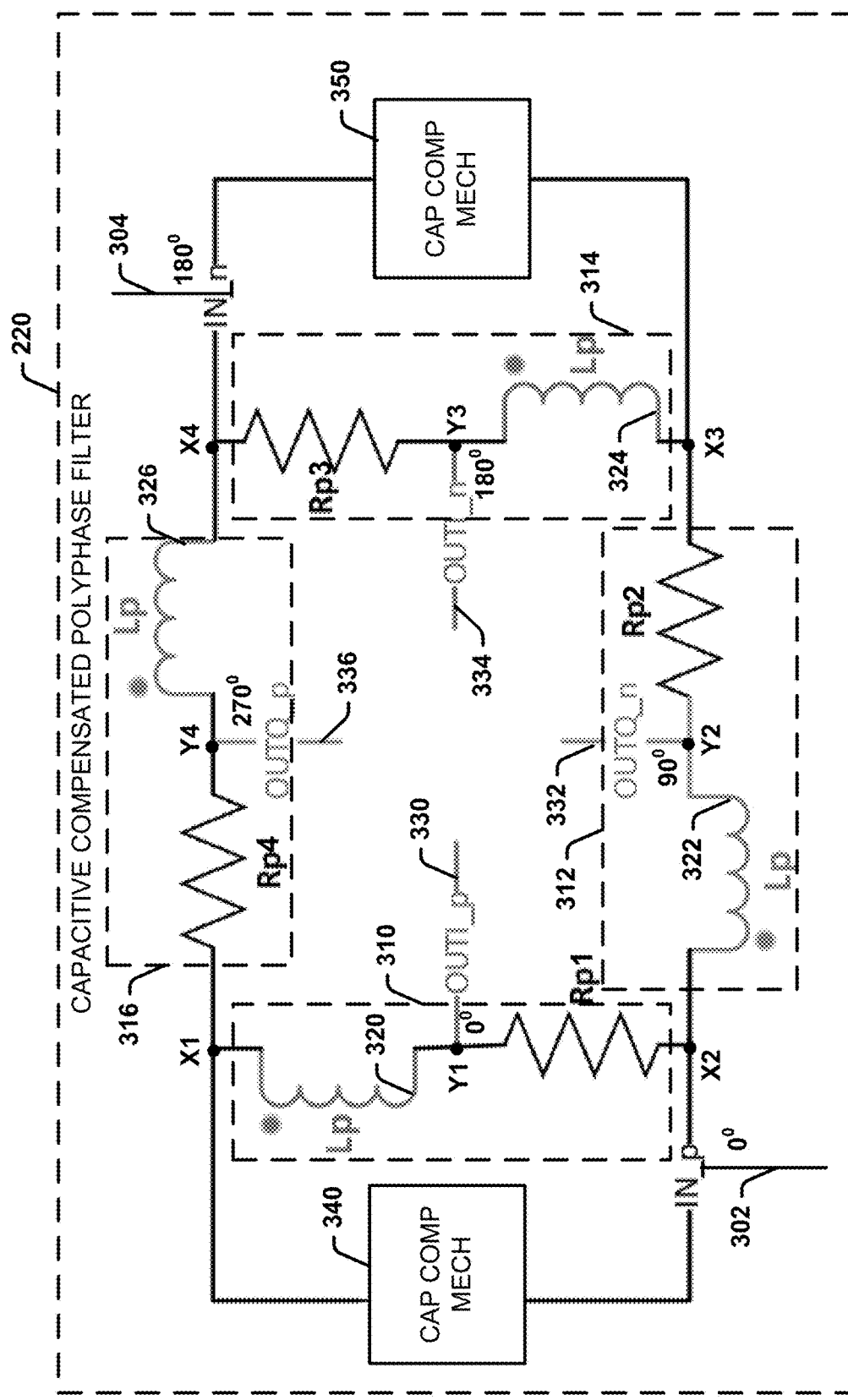
FIG. 3 is an example of a capacitor compensated polyphase filter (network) in accordance with various aspects described.

Referring to FIG. 3, illustrated is an example embodiment of schematic diagram of a design of a capacitive compensated polyphase network 220 with filter paths 310-316 forming a differential polyphase filtering circuit comprising capacitive capacitor mechanisms 340, 350. As used herein, a mechanism can be one or more components, such as a capacitor compensation mechanism/component, for example, the mechanism/component is intended to denote a structure as a mechanism or a component modified by a capacitor, a compensation, or both a capacitor and a compensation.

Capacitive compensated polyphase network 220 receives a differential input signal IN_p and IN_n at terminals 302, 304, respectively, as oscillator or voltage signals. From the differential input signal IN_p and IN_n at terminals 302, 304, respectively, the capacitive compensated polyphase network 220 can provide a first differential output signal comprising OUTI_p and OUTI_n signals and a second differential output signal comprising OUT2_p and OUT2_n signals. Capacitive compensated polyphase network 220 includes four paths 310-316 for the four OUT signals at output terminal 330-336.

The first path 310 includes an inductor 320 coupled between an internal input node X1 and output node Y1 and a resistor Rp1 coupled between output node Y1 and input node X2 connected to input terminal 302. The second path 312 includes an inductor 322 coupled between input node X2 and output node Y2 at output terminal 332 and a resistor Rp2 coupled between output node Y2 and input node X3. The third path 314 includes an inductor 324 coupled between input node X3 and output node Y3 at output terminal 334 and a resistor Rp3 coupled between output node Y3 and input node X4 connected to input terminal 304. The fourth path 316 includes an inductor 326 coupled between input node X4 and output node Y4 at output terminal 336 and a resistor Rp4 coupled between output node Y4 and internal input node X1.

Each inductor 320-326 has an inductance of Lp, and each resistor Rp1-Rp4 has a resistance of Rp. The IN_p signal is provided to internal input node X1 as a first driving input from the capacitive compensation mechanism 340, and at X2. The nodes X2 and X4 are configured as direct driving inputs that receive the input IN_P and IN_n, respectively. Nodes X2 and X4 are at an interface point/node of the capacitive compensated polyphase network 220 that are tapped by the input terminals 302 and 304 directly without modification of any other electrical component thereat. The IN_p signal and IN_n signals are further provided to input nodes X2 and X4 directly at an interface point/node of the capacitive compensated polyphase network 220 without modification of any electric component, and via the capacitive compensation mechanisms 340 and 350, respectively.

The input terminals 302 and 304 provide a single-ended inputs with signals IN_p and IN_n, with each terminal enabling a two single-ended output (e.g., output terminals 330-336). The OUTI_p at terminal 330, OUTQ_n at terminal 332, OUTI_n, and OUTQ_p are provided by output nodes Y1, Y2, Y3 and Y4, respectively. The phases of the IN_p and IN_n signals and the phases of the OUTI_p, OUTI_n, OUTQ_n and OUTQ_p signals are also illustrated at 0°, 90°, 180°, 270°, for example.

The capacitor compensation mechanisms 340, 350 are coupled to internal nodes X1 and X3, and input nodes X2 and X4. These internal nodes X1 and X3 are internal to the polyphase filter formed by the first, second, third and fourth paths 310-316 that form an inductor resistor polyphase filter. In contrast, nodes X2 and X4 provide direct inputs to the capacitive compensated polyphase filter network 220 from a 180 degree coupler or an oscillator component (e.g., 210) generating a differential signal thereat based on a control signal from processor 102, or the like, for example.

Capacitor compensation mechanisms 340, 350 are configured to drive X1 and X3 nodes as additional nodes untapped by an input terminal, and thus inducing the filtering behavior of an inductive-resistive polyphase filter network as a four-phase polyphase filter network compensated by a capacitor compensated dual. The capacitor compensated dual modifies the polyphase filter to be more fully stable across, or during, changes in a load across output terminals 330-336. These changes can be across different loads or networks at the different outputs for OUTI_p, OUTI_n, OUTQ_n and OUTQ_p, which are inductive or enable inductive impedances looking into the polyphase filter side of a matching network, for example. Concurrently, input terminals 302 and 304 directly drive nodes X2 and X4 of the capacitive compensated polyphase network 220 to perform stable polyphase filter at different phases or stages across 360 degrees with improved IQ performance characteristics and an increase in stability with load changes, especially across process variations, electrical variations, or temperature variations in time.

In an aspect, the capacitor compensation mechanisms 340, 350 can drive the network 220 at untapped nodes X1 and X3 while input terminals 302 and 304 drive nodes X2 and X4 directly with input signals IN_p and IN_n. The capacitor compensation mechanisms 340, 350 can further operate as such with a phase change across each mechanism 340, 350. Nodes X1 and X3 are untapped nodes that are independently driven and by a source that is at a different phase than the nodes X2 and X4 being directly driven directly by the inputs at input terminals 302 and 304, respectively.

In an aspect, the inductors 320 and 324 of the first differential output signal (e.g., in-phase output signals OUTI_p and OUTI_n) can be magnetically/electrically coupled to one another mutually in a same spiral in an anti-coupled manner or coupled in anti-phase to one another. Likewise, the inductors 322 and 326 of the second differential output signal (e.g., quadrature output signals OUTQ_p and OUTQ_n) can be magnetically/electrically coupled to one another mutually in a same spiral in an anti-coupled manner or coupled in anti-phase to one another. The dots on each inductor 322-326 indicate the sign or direction of the electromagnetic coupling. The anti-coupling between inductor coupled pairs 320 and 324, and 322 and 326 reduces the area of the chip area used and enables only two spirals to be fabricated for the capacitive compensated polyphase network 220 to save chip area.

Figure 4:
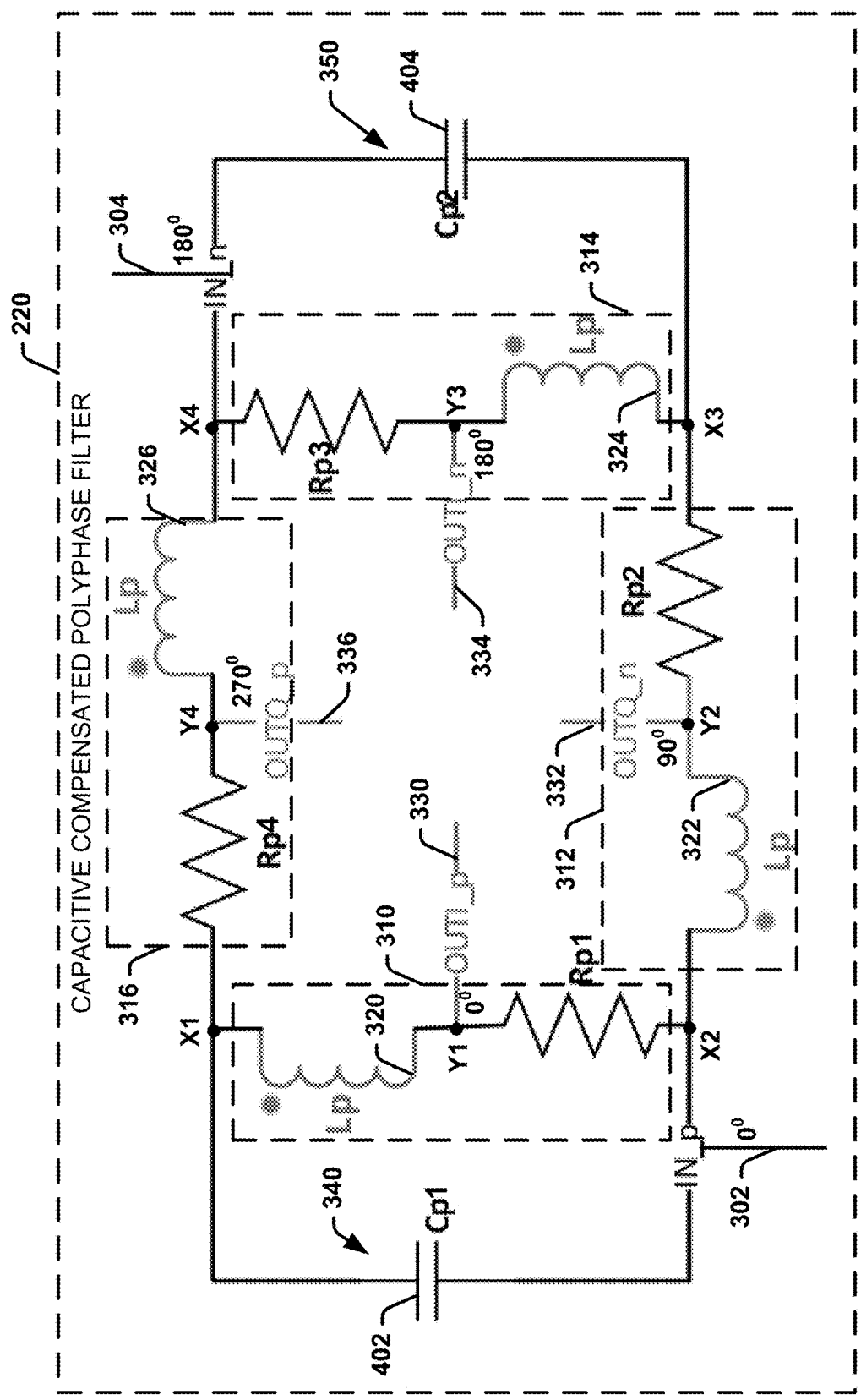
FIG. 4 is another example of a capacitor compensated polyphase filter (network) in accordance with various aspects described.

Referring to FIG. 4, illustrated is another embodiment of the capacitive compensated polyphase network 220. As one example, capacitor compensation mechanisms 340, 350 can include at least one capacitor 402 and 404, respectively as a component of the compensated polyphase network 220. These components can also optionally include other electric circuitry or related components, for example, additionally or alternatively. The capacitor 402 and 404 can each be one or more capacitors coupled in parallel to different paths (e.g., first path 310, or third path 334) of the capacitive compensated polyphase network 220 to enable a capacitive compensated dual at different phases and an output impedance that is inductive, obviating additional matching network elements to drive various loads (e.g., CMOS loads).

The capacitors 402 and 404 are matched and equivalent, but can have a same or different capacitances Cp1 and Cp2 driving untapped nodes X1, and X3, and across first path 310 and the third path 314. Similarly, the resistors Rp1-Rp4 are matched and equivalent, but can also be configured as the same or different from one another. The inductor 320 and resistor Rp1 in the first path 310 can form a high pass filter (as a first path/leg) that provides a 45 degree phase lead at a fixed frequency bandwidth as determined by the values of Lp at inductor 320 and resistor Rp1. Resistor Rp2 and inductor 322 in the second path 312 can further form a low pass filter with a 45 degree phase lag at a bandwidth (e.g., about a 3 dB, or otherwise) as determined by the values of Lp at inductor 322 and resistor Rp2. Alternatively, if the inductors were replaced with capacitors the first path 310 can be a high pass filter and the second path 312 form a low pass filter. As such, the capacitor compensated polyphase network 220 as illustrated here can comprises a multi-path (multi-leg) network comprising a first path that includes a first inductor high pass filter coupled to a first inductor low pass filter, including the first and second paths 310, 312, and a second path that includes a second inductor high pass filter coupled to a second inductor low pass filter, including the third and fourth paths 314, 316.

In another aspect, the capacitor compensation mechanisms 340, 350 are configured to provide additional lag circuits to configure a polyphase network that is not susceptible to loading and at the same time because of the input drive operation very close to the ideal 3 dB. The capacitor compensation mechanisms 340, 350 further provide a resistance to load changes and improved in-phase/quadrature (IQ) characteristics as detailed further below. IQ performance can refer to amplitude imbalance as well as phase imbalance of an output of the capacitor compensated polyphase network. An ideal phase difference is approximately 90 degrees, while an ideal IQ amplitude imbalance is zero, for example, across load changes between inputs and outputs of the network.

Ideally, if one part of the capacitor compensated polyphase network 220 is split into two in order for power to be conserved, for example, a loss of 3 dB could be seen from each of the inputs with no loss as an ideal network. Thus, normally the polyphase filter could have about 6 dB in total (3 dB due to the power split and another 3 dB lost into the network resistors). This is the IQ performance, which can be characterized based on the amplitude imbalance and the phase imbalance.

Figure 5:
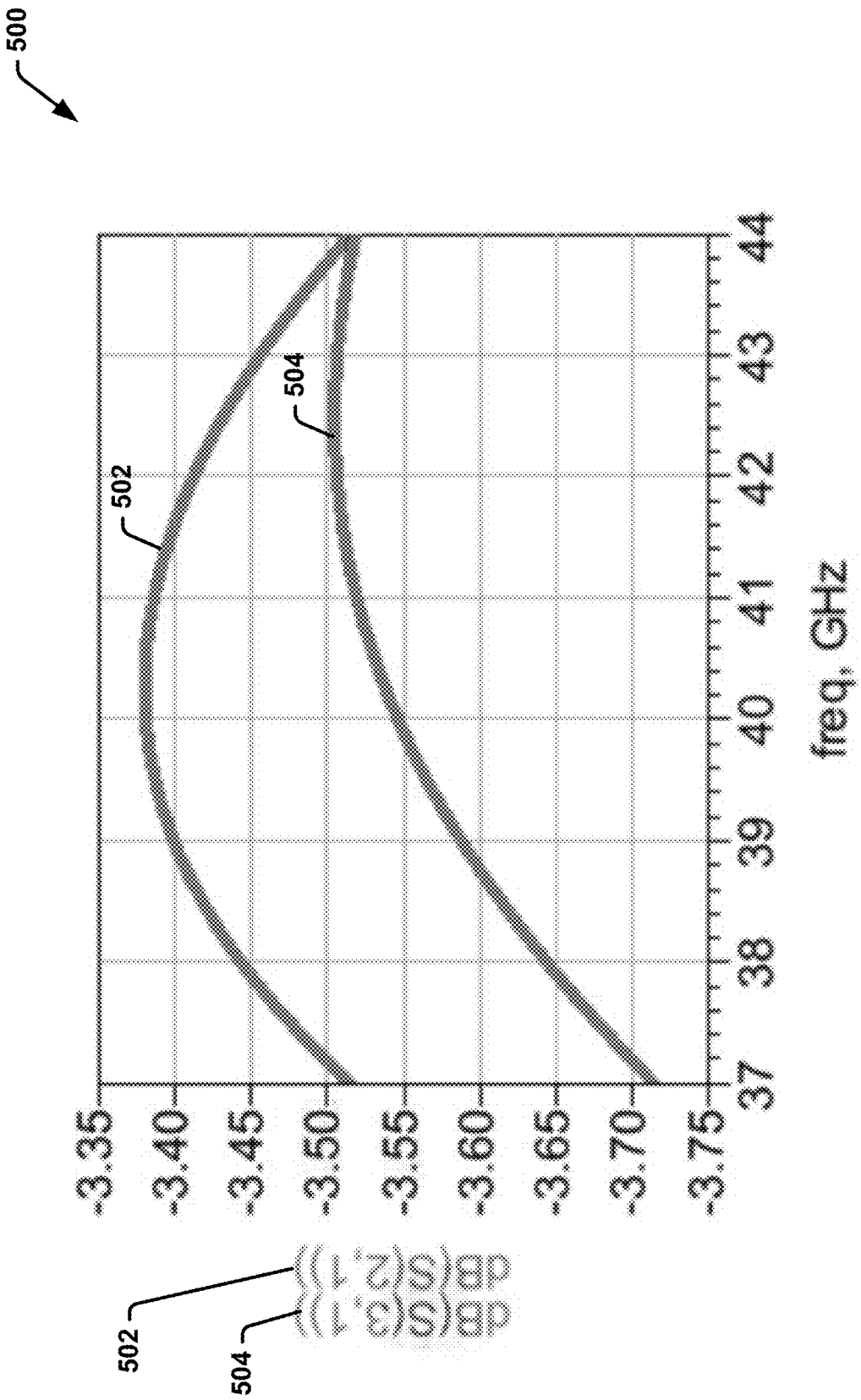
FIG. 5 is an example power curve of scattering results of capacitor compensated polyphase filter in accordance with various aspects described.

Referring to FIG. 5, illustrated is an example of scattering parameter results (in dB) associated with the capacitor compensated polyphase network 220. S(2,1) demonstrates a power curve 502 of a power gain from an input to an in-phase output (loaded with a high impedance capacitance). S(3,1) demonstrates a power curve 504 of power gain from an input to a quadrature output (loaded with a high impedance capacitance).

Figure 6:
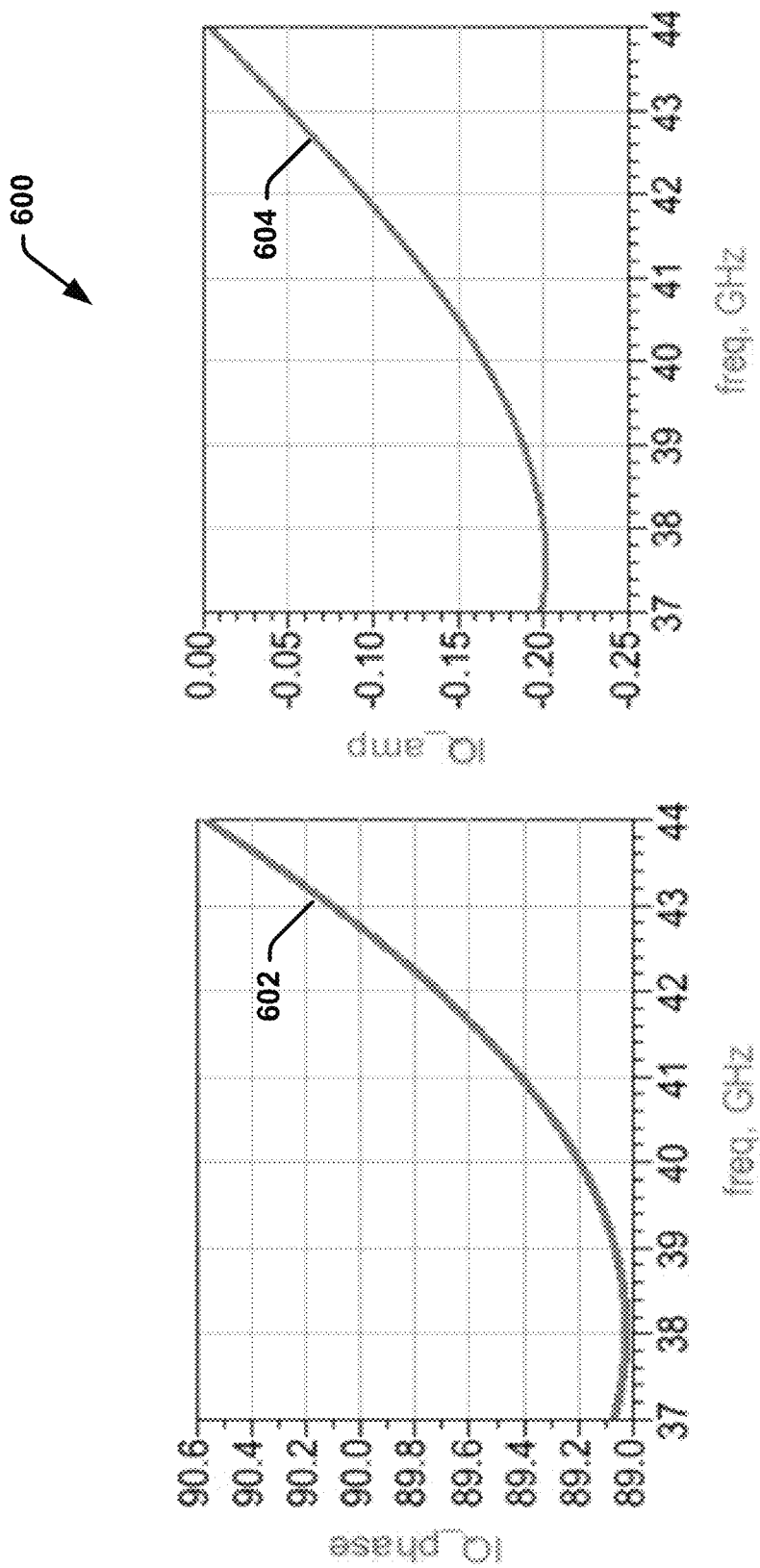
FIG. 6 illustrates example phase and amplitude curves of a capacitor compensated polyphase filter in accordance with various aspects described.

Referring to FIG. 6, illustrated is an example of performance results 600 associated with the capacitor compensated polyphase network 220. The curves 600 indicate an IQ_phase across frequency. IQ_phase is the phase difference between I and Q inputs, in which the ideal value can be 90 degrees. IQ_amp is the amplitude difference in dB between I and Q inputs, where for an IQ amplitude difference (IQ_amp) the ideal is zero dB. Curve 602 demonstrates an example IQ_phase over frequency and curve 604 demonstrates an example IQ_amp across frequency in GHz, for example.

Figure 7:
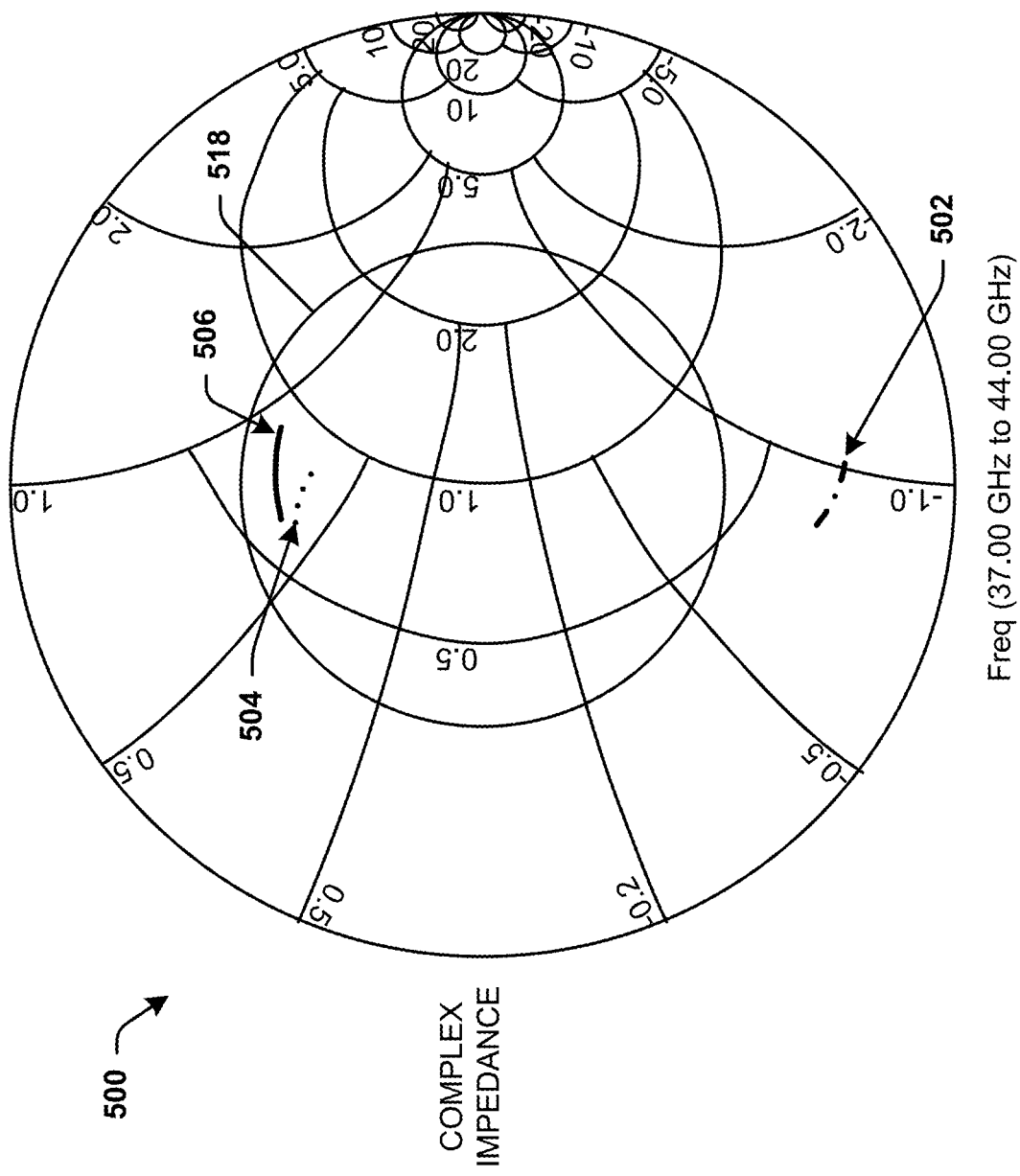
FIG. 7 is an example Smith Chart of a capacitor compensated polyphase filter in accordance with various aspects described.

Referring to FIG. 7, illustrated is an example Smith Chart 700 in accordance with various aspects/embodiments. The chart 700 demonstrates a capacitive mixer impedance 502 that is nearly the complex conjugate of an output impedance of the capacitor compensated polyphase network 220 for a condition of a maximum power transfer.

The Smith Chart 700 provides a polar diagram of a reflection and in a manner a corresponding impedance with a left reference point representing an impedance of zero and a right reference point representing an impedance of infinity. As can be seen, two loads 504 and 506 are demonstrated as being close to one another, but not exact or perfectly matching. Without the capacitor compensation mechanisms 540, 550 these two loads would be much further apart from one another. As such, if the network is out of tune, the output impedances are capacitive or both loads could be capacitive and different. Then, with an inductive network as with the capacitor compensated polyphase network 220 phase is being added back on them equally. The result could be causing an effect that is different between the two. Thus, process variations, temperature variations or the like can end up changing the phases, causing further imbalance.

Thus, to avoid additional networks such as with providing a conjugate match with two identical networks side by side for a maximum power transfer to the exact same point in order to preserve IQ characteristics, the dual of the capacitive compensated polyphase network 220 can be provided with a phase lag on drive paths.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
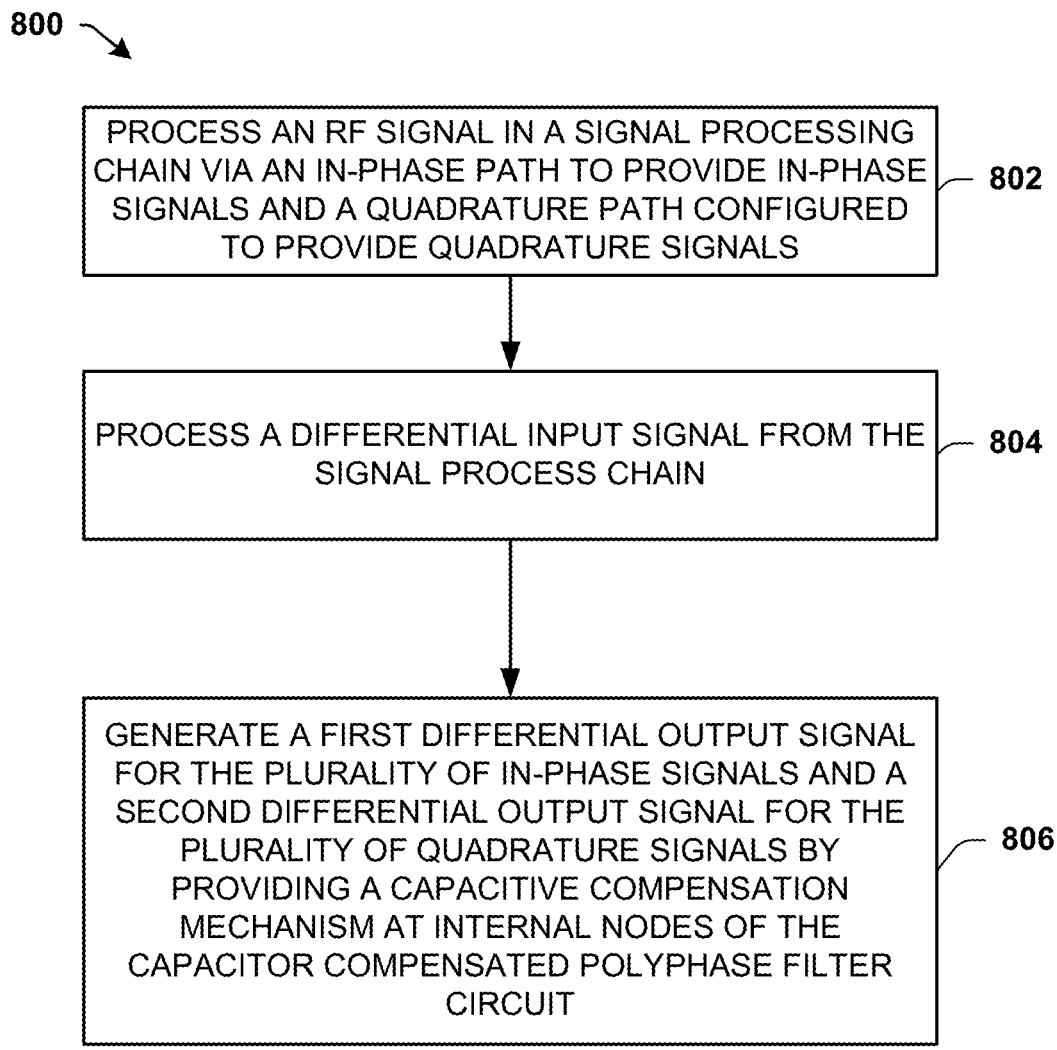
FIG. 8 is a flow diagram illustrating a method of polyphase filtering according to various aspects described.

Referring to FIG. 8, illustrated is a method 800 for a method for performing polyphase filtering via a capacitor compensated polyphase filter circuit. As process flow, the method 800 initiates at 802 with processing a radio frequency signal in a signal processing chain via an in-phase path configured to provide a plurality of in-phase signals and a quadrature path configured to provide a plurality of quadrature signals.

At 804, the method 800 further comprises processing a differential input signal from the signal process chain.

At 806, the method 800 further comprises generating, via a quadrature signal generator, or other circuit as provided herein, a first differential output signal for the plurality of in-phase signals and a second differential output signal for the plurality of quadrature signals by providing a capacitive compensation mechanism at internal nodes of the capacitor compensated polyphase filter circuit.

The method 800 can further include any of the aspects/embodiments/examples that are disclosed herein.

For example, the method 800 can include generating an inductive load at first output terminals of the first differential output signal and at second output terminals of the second differential output signal. The capacitor compensated polyphase filter circuit can be driven or powered electrically via the differential input signal at a first input of a differential input, across the capacitor compensated polyphase filter circuit at a first node of the internal nodes by a first capacitor coupled to the first input, and at a second node tapped at the first input. Additionally, the method can include driving, via the differential input signal at a second input of the differential input, the capacitor compensated polyphase filter circuit at a third internal node of the internal nodes by a second capacitor coupled to the second input, and at a fourth node tapped to the second input.

Figure 9:
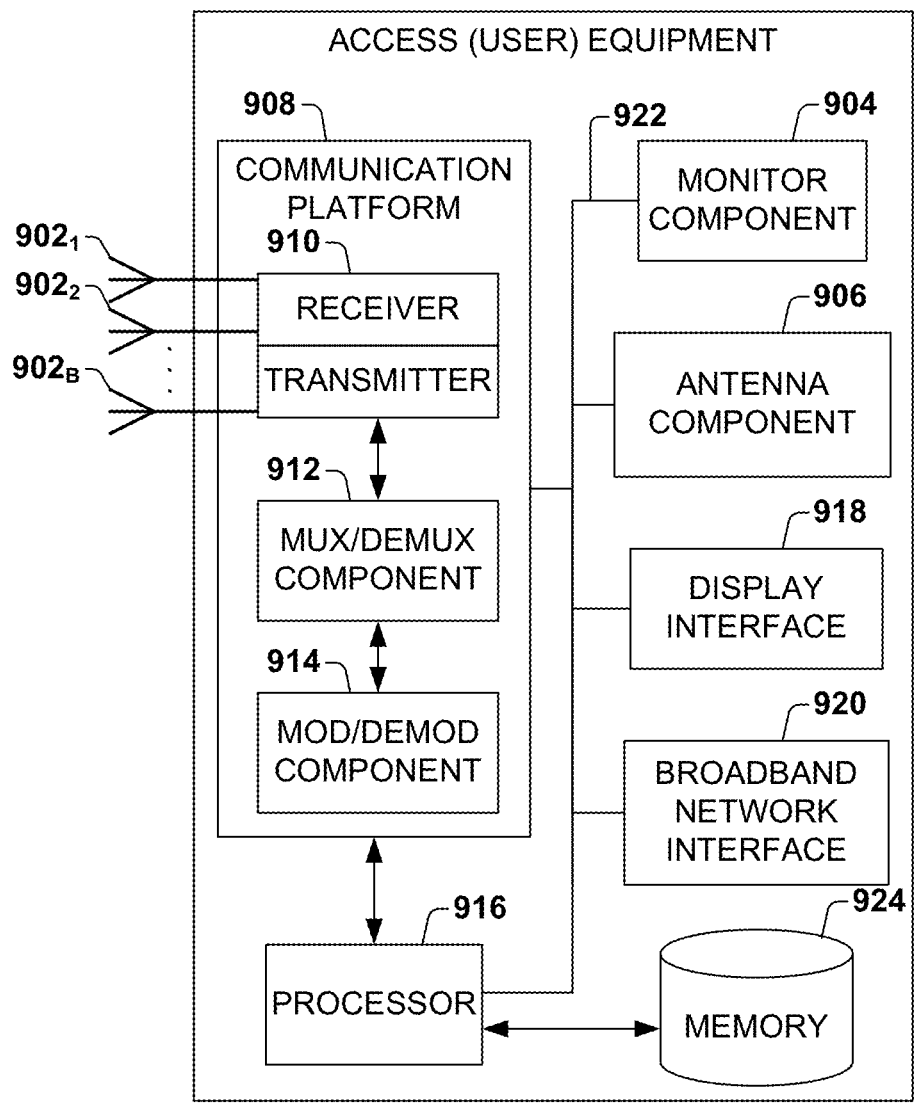
FIG. 9 is another example architecture of a user (access) equipment for implementing various aspects described.

To provide further context for various aspects of the disclosed subject matter, FIG. 9 illustrates a block diagram of an embodiment of access (user) equipment related to access of a network (e.g., base station, wireless access point, femtocell access point, and so forth) that can enable and/or exploit features or aspects disclosed herein.

Access equipment, UE and/or software related to access of a network can receive and transmit signal(s) from and to wireless devices, wireless ports, wireless routers, etc. through segments $902_1$-$902_B$ (B is a positive integer). Segments $902_1$-$902_B$ can be internal and/or external to access equipment and/or software related to access of a network, and can be controlled by a monitor component 904 and an antenna component 906. Monitor component 904 and antenna component 906 can couple to communication platform 908, which can include electronic components and associated circuitry that provide for processing and manipulation of received signal(s) and other signal(s) to be transmitted.

In an aspect, communication platform 908 includes a receiver/transmitter 910 that can convert analog signals to digital signals upon reception of the analog signals, and can convert digital signals to analog signals upon transmission. In addition, receiver/transmitter 910 can divide a single data stream into multiple, parallel data streams, or perform the reciprocal operation. Coupled to receiver/transmitter 910 can be a multiplexer/demultiplexer 912 that can facilitate manipulation of signals in time and frequency space. Multiplexer/demultiplexer 912 can multiplex information (data/traffic and control/signaling) according to various multiplexing schemes such as time division multiplexing, frequency division multiplexing, orthogonal frequency division multiplexing, code division multiplexing, space division multiplexing. In addition, multiplexer/demultiplexer component 912 can scramble and spread information (e.g., codes, according to substantially any code known in the art, such as Hadamard-Walsh codes, Baker codes, Kasami codes, polyphase codes, and so forth).

A modulator/demodulator 914 is also a part of communication platform 908, and can modulate information according to multiple modulation techniques, such as frequency modulation, amplitude modulation (e.g., M-ary quadrature amplitude modulation, with M a positive integer); phase-shift keying; and so forth).

Access equipment and/or software related to access of a network also includes a processor 916 configured to confer, at least in part, functionality to substantially any electronic component in access equipment and/or software. In particular, processor 916 can facilitate configuration of access equipment and/or software through, for example, monitor component 904, antenna component 906, and one or more components therein. Additionally, access equipment and/or software can include display interface 918, which can display functions that control functionality of access equipment and/or software or reveal operation conditions thereof. In addition, display interface 918 can include a screen to convey information to an end user. In an aspect, display interface 918 can be a liquid crystal display, a plasma panel, a monolithic thin-film based electrochromic display, and so on. Moreover, display interface 918 can include a component (e.g., speaker) that facilitates communication of aural indicia, which can also be employed in connection with messages that convey operational instructions to an end user. Display interface 918 can also facilitate data entry (e.g., through a linked keypad or through touch gestures), which can cause access equipment and/or software to receive external commands (e.g., restart operation).

Broadband network interface 920 facilitates connection of access equipment and/or software to a service provider network (not shown) that can include one or more cellular technologies (e.g., third generation partnership project universal mobile telecommunication system, global system for mobile communication, and so on) through backhaul link(s) (not shown), which enable incoming and outgoing data flow. Broadband network interface 920 can be internal or external to access equipment and/or software and can utilize display interface 918 for end-user interaction and status information delivery.

Processor 916 can be functionally connected to communication platform 908 and can facilitate operations on data (e.g., symbols, bits, or chips) for multiplexing/demultiplexing, such as effecting direct and inverse fast Fourier transforms, selection of modulation rates, selection of data packet formats, inter-packet times, and so on. Moreover, processor 916 can be functionally connected, through data, system, or an address bus 922, to display interface 918 and broadband network interface 920, to confer, at least in part, functionality to each of such components.

In access equipment and/or software memory 924 can retain location and/or coverage area (e.g., macro sector, identifier(s)) access list(s) that authorize access to wireless coverage through access equipment and/or software sector intelligence that can include ranking of coverage areas in the wireless environment of access equipment and/or software, radio link quality and strength associated therewith, or the like. Memory 924 also can store data structures, code instructions and program modules, system or device information, code sequences for scrambling, spreading and pilot transmission, access point configuration, and so on. Processor 916 can be coupled (e.g., through a memory bus), to memory 924 in order to store and retrieve information used to operate and/or confer functionality to the components, platform, and interface that reside within access equipment and/or software.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

In one set of examples, an apparatus of a communication circuit can comprise a capacitor compensated polyphase network configured to receive a differential input signal at differential driving inputs and provide a first differential output signal at first differential outputs and a second differential output signal at second differential outputs. The capacitor compensated polyphase network can comprise: a capacitive compensation mechanism comprising a first phase lag circuit between a first node and a second node and a second phase lag circuit coupled between a third node and a fourth node. The first node is coupled to the second node via a first inductor coupled to a first resistor, the second node is coupled to the third node via a second inductor coupled to a second resistor, the third node is coupled to the fourth node via a third inductor coupled to a third resistor, and the fourth node is coupled to the first node via a fourth inductor coupled to a fourth resistor.

In another example of the first set of examples, the capacitor compensated polyphase network is configured as a polyphase filter configured to drive two different loads with four different phases for an equivalent output to both of the two different loads.

In another example of the first set of examples, the first phase lag circuit can comprise at least one first capacitor, and the second phase lag circuit comprises at least one second capacitor, and the capacitor compensated polyphase network is further configured to generate a different phase change across the at least one first capacitor and the at least one second capacitor, respectively.

In another example of the first set of examples, the capacitor compensated polyphase network is further configured to generate an inductive load at first output terminals of the first differential output signal and at second output terminals of the second differential output signal.

In another example of the first set of examples, the capacitive compensation mechanism can further comprise: a first polyphase filter path comprising the first node coupled to the second node via the first inductor coupled to the first resistor, and a first in-phase output terminal of the first differential outputs coupled to a first output node between the first inductor and the first resistor; a second polyphase filter path can comprise the second node coupled to the third node via the second inductor coupled to the second resistor, and a first quadrature output terminal of the second differential outputs coupled to a second output node between the second inductor and the second resistor; a third polyphase filter path can comprise the third node coupled to the fourth node via the third inductor coupled to the third resistor, and a second in-phase output terminal of the first differential outputs coupled to a third output node between the third inductor and the third resistor; and a fourth polyphase filter path can comprise the fourth node coupled to the first node via the fourth inductor coupled to the fourth resistor, and a second quadrature output terminal of the second differential outputs coupled to a fourth output node between the fourth inductor and the fourth resistor.

In another example of the first set of examples, the differential driving inputs can comprise: a first differential input terminal of the differential driving inputs, connected to the second node, configured to provide a first driving source to the second node and to the first node via a capacitor of the first phase lag circuit, wherein the first node comprises a first internal node of the capacitor compensated polyphase network that is untapped, while the second node is tapped by the first differential input terminal; a second differential input terminal of the differential driving inputs connected to the fourth node, configured to provide a second driving source to the fourth node and to the third internal node via a capacitor of the second phase lag circuit, wherein the third node comprises a second internal node of the capacitor compensated polyphase network that is untapped, while the fourth node is tapped by the second differential input terminal.

In another example of the first set of examples, the first inductor is magnetically coupled to the third inductor with anti-phase coupling to provide first differential output signals at first differential outputs, and the second inductor is magnetically coupled with an anti-phase coupling to the fourth inductor to provide second differential output signals at second differential outputs.

In another example of the first set of examples, wherein the first inductor and the third inductor can comprise a first inductor spiral, and the second inductor and the fourth inductor comprise a second inductor spiral.

In a second set of examples, a system of a mobile device can comprise: an antenna port configured to receive or provide an analog signal; a radio-frequency (RF)-frontend coupled to the antenna port; a signal processing chain comprising an in-phase path configured to provide an in-phase signal and a quadrature path configured to provide a quadrature signal; a quadrature signal generator, coupled to the in-phase path and the quadrature path, comprising a capacitor compensated polyphase network, coupled to a local oscillator (LO), configured to receive a differential input signal and provide a first differential output signal and a second differential output signal for the signal processing chain, by providing a capacitive compensation mechanism at one or more internal nodes of the compensated polyphase network.

In an example of the second set of examples, the capacitor compensated polyphase network is further configured to generate an inductive load at first output terminals of the first differential output signal and at second output terminals of the second differential output signal.

In another example of the second set of examples, the capacitor compensated polyphase network can comprise a first stage that includes a first inductor high pass filter coupled to a first inductor low pass filter, and a second stage that includes a second inductor high pass filter coupled to a second inductor low pass filter.

In another example of the second set of examples, the capacitive compensation mechanism can comprise: at least one first capacitor coupled to a first node of the capacitor compensated polyphase network at a first location between the first stage and the second stage and to a second node of the capacitor compensated polyphase network at a second location between the first stage and the second stage; and at least one second capacitor coupled to a third node of the capacitor compensated polyphase network at a third location between the first stage and the second stage and to a fourth node of the capacitor compensated polyphase network at a second location between the first stage and the second stage.

In another example of the second set of examples, the capacitive compensation mechanism is configured to provide a phase lag to drive two different loads with four different phases for an equivalent output to the two different loads.

In another example of the second set of examples, the signal processing chain comprises a vector-sum phase shifter configured to selectively filter a radio frequency input signal for a bandwidth selection in a millimeter wave band via the capacitor compensated polyphase network of the quadrature signal generator.

In another example of the second set of examples, wherein the first differential output signal and the second differential output signal can comprise balanced outputs at pairs of output terminals, respectively, wherein a complex impedance of an in-phase output is approximately equal to a quadrature output at the pairs of output terminals.

In another example of the second set of examples, the capacitor compensated polyphase network further can comprise a polyphase filter configured to generate in-phase output signals at in-phase (I) outputs and quadrature signals at quadrature (Q) outputs concurrently with a power matching therebetween while maintaining an I/Q performance balance over a change in a load coupled to pairs of output terminals configured to receive the first differential output signal and the second differential output signal comprise balanced outputs.

In another example of the second set of examples, the capacitive compensation mechanism is configured to provide a phase lag to the capacitor compensated polyphase network to reduce a network imbalance from a load.

In another example of the second set of examples, the capacitor compensated polyphase network can comprise a first pair of inductors anti-coupled to one another in a first inductor spiral, and a second pair of inductors anti-coupled to one another in a second inductor spiral.

In another example of the second set of examples, the capacitive compensation mechanism can comprise a first phase lag circuit coupled between a first node and a second node of the compensated polyphase network, and a second phase lag circuit coupled between a third node and a fourth node, wherein the first node is coupled to the second node via a first inductor and a first resistor, the second node is coupled to the third node via a second inductor and a first resistor, the third node is coupled to the fourth node via a third inductor and a third resistor, and the fourth node is coupled to the first node via a fourth inductor and a fourth resistor.

In a third set of examples, a method for performing polyphase filtering via a capacitor compensated polyphase filter circuit can comprise: processing a radio frequency signal in a signal processing chain via an in-phase path configured to provide a plurality of in-phase signals and a quadrature path configured to provide a plurality of quadrature signals; processing a differential input signal; and generating, via a quadrature signal generator, a first differential output signal for the plurality of in-phase signals and a second differential output signal for the plurality of quadrature signals, by providing a capacitive compensation mechanism at internal nodes of the capacitor compensated polyphase filter circuit.

In an example of the third set of examples, the method can further comprise: generating an inductive load at first output terminals of the first differential output signal and at second output terminals of the second differential output signal.

In another example of the third set of examples, the method can further comprise: driving, via the differential input signal at a first input of a differential input, the capacitor compensated polyphase filter circuit at a first node of the internal nodes by a first capacitor coupled to the first input, and at a second node tapped at the first input; and driving, via the differential input signal at a second input of the differential input, the capacitor compensated polyphase filter circuit at a third internal node of the internal nodes by a second capacitor coupled to the second input, and at a fourth node tapped to the second input.

Examples can include one or more non-transitory computer-readable media comprising instructions to cause an electronic device, upon execution of the instructions by one or more processors of the electronic device, to perform one or more elements of a method described in or related to any of examples above, or any other method or process described herein.

Examples can include an apparatus comprising logic, modules, or circuitry to perform one or more elements of a method described in or related to any of examples above, or any other method or process described herein.

Examples can include a method, technique, or process as described in or related to any of examples above, or portions or parts thereof.

Examples can include an apparatus comprising: one or more processors and one or more computer readable media comprising instructions that, when executed by the one or more processors, cause the one or more processors to perform the method, techniques, or process as described in or related to any of examples above, or portions thereof.

Examples can include a method of communicating in a wireless network as shown and described herein.

Examples can include a system for providing wireless communication as shown and described herein.

Examples can include a device for providing wireless communication as shown and described herein.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM☐, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the acts and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. An apparatus of a communication circuit comprising:
a capacitor compensated polyphase network configured to receive a differential input signal at differential driving inputs and provide a first differential output signal at first differential outputs and a second differential output signal at second differential outputs, the capacitor compensated polyphase network comprising:
a capacitive compensation mechanism comprising a first phase lag circuit between a first node and a second node and a second phase lag circuit coupled between a third node and a fourth node;
wherein the first node is coupled to the second node via a first inductor coupled to a first resistor, the second node is coupled to the third node via a second inductor coupled to a second resistor, the third node is coupled to the fourth node via a third inductor coupled to a third resistor, and the fourth node is coupled to the first node via a fourth inductor coupled to a fourth resistor.

2. The apparatus of claim 1, wherein the capacitor compensated polyphase network is configured as a polyphase filter configured to drive two different loads with four different phases for an equivalent output to both of the two different loads.

3. The apparatus of claim 1, wherein the first phase lag circuit comprises at least one first capacitor, and the second phase lag circuit comprises at least one second capacitor, and the capacitor compensated polyphase network is further configured to generate a different phase change across the at least one first capacitor and the at least one second capacitor, respectively.

4. The apparatus of claim 1, wherein the capacitor compensated polyphase network is further configured to generate an inductive load at first output terminals of the first differential output signal and at second output terminals of the second differential output signal.

5. The apparatus of claim 1, wherein the capacitive compensation mechanism further comprises:
a first polyphase filter path comprising the first node coupled to the second node via the first inductor coupled to the first resistor, and a first in-phase output terminal of the first differential outputs coupled to a first output node between the first inductor and the first resistor;
a second polyphase filter path comprising the second node coupled to the third node via the second inductor coupled to the second resistor, and a first quadrature output terminal of the second differential outputs coupled to a second output node between the second inductor and the second resistor;
a third polyphase filter path comprising the third node coupled to the fourth node via the third inductor coupled to the third resistor, and a second in-phase output terminal of the first differential outputs coupled to a third output node between the third inductor and the third resistor; and
a fourth polyphase filter path comprising the fourth node coupled to the first node via the fourth inductor coupled to the fourth resistor, and a second quadrature output terminal of the second differential outputs coupled to a fourth output node between the fourth inductor and the fourth resistor.

6. The apparatus of claim 5, wherein the differential driving inputs comprise:
a first differential input terminal of the differential driving inputs, connected to the second node, configured to provide a first driving source to the second node and to the first node via a capacitor of the first phase lag circuit, wherein the first node comprises a first internal node of the capacitor compensated polyphase network that is untapped, while the second node is tapped by the first differential input terminal;
a second differential input terminal of the differential driving inputs connected to the fourth node, configured to provide a second driving source to the fourth node and to the third internal node via a capacitor of the second phase lag circuit, wherein the third node comprises a second internal node of the capacitor compensated polyphase network that is untapped, while the fourth node is tapped by the second differential input terminal.

7. The apparatus of claim 1, wherein the first inductor is magnetically coupled to the third inductor with anti-phase coupling to provide first differential output signals at first differential outputs, and the second inductor is magnetically coupled with an anti-phase coupling to the fourth inductor to provide second differential output signals at second differential outputs.

8. The apparatus of claim 7, wherein the first inductor and the third inductor comprise a first inductor spiral, and the second inductor and the fourth inductor comprise a second inductor spiral.

9. A system of a mobile device comprising:
an antenna port configured to receive or provide an analog signal;

a radio-frequency (RF)-frontend coupled to the antenna port;

a signal processing chain comprising an in-phase path configured to provide an in-phase signal and a quadrature path configured to provide a quadrature signal;

a quadrature signal generator, coupled to the in-phase path and the quadrature path, comprising a capacitor compensated polyphase network, coupled to a local oscillator (LO), configured to receive a differential input signal and provide a first differential output signal and a second differential output signal for the signal processing chain, by providing a capacitive compensation mechanism at one or more internal nodes of the compensated polyphase network, wherein the capacitor compensated polyphase network comprises a first stage that includes a first inductor high pass filter coupled to a first inductor low pass filter, and a second stage that includes a second inductor high pass filter coupled to a second inductor low pass filter.

10. The system of claim 9, wherein the capacitor compensated polyphase network is further configured to generate an inductive load at first output terminals of the first differential output signal and at second output terminals of the second differential output signal.

11. The system of claim 9, wherein the capacitive compensation mechanism comprises:
at least one first capacitor coupled to a first node of the capacitor compensated polyphase network at a first location between the first stage and the second stage and to a second node of the capacitor compensated polyphase network at a second location between the first stage and the second stage; and
at least one second capacitor coupled to a third node of the capacitor compensated polyphase network at a third location between the first stage and the second stage and to a fourth node of the capacitor compensated polyphase network at a second location between the first stage and the second stage.

12. The system of claim 9, wherein the capacitive compensation mechanism is configured to provide a phase lag to drive two different loads with four different phases for an equivalent output to the two different loads.

13. The system of claim 9, wherein the signal processing chain comprises a vector-sum phase shifter configured to selectively filter a radio frequency input signal for a bandwidth selection in a millimeter wave band via the capacitor compensated polyphase network of the quadrature signal generator.

14. The system of claim 9, wherein the first differential output signal and the second differential output signal comprise balanced outputs at pairs of output terminals, respectively, wherein a complex impedance of an in-phase output is approximately equal to a quadrature output at the pairs of output terminals.

15. The system of claim 9, wherein the capacitor compensated polyphase network further comprises a polyphase filter configured to generate in-phase output signals at in-phase (I) outputs and quadrature signals at quadrature (Q) outputs concurrently with a power matching therebetween while maintaining an I/O performance balance over a change in a load coupled to pairs of output terminals configured to receive the first differential output signal and the second differential output signal comprise balanced outputs.

16. The system of claim 9, wherein the capacitive compensation mechanism is configured to provide a phase lag to the capacitor compensated polyphase network to reduce a network imbalance from a load.

17. The system of claim 9, wherein the capacitor compensated polyphase network comprises a first pair of inductors anti-coupled to one another in a first inductor spiral, and a second pair of inductors anti-coupled to one another in a second inductor spiral.

18. The system of claim 9, wherein the capacitive compensation mechanism comprises a first phase lag circuit coupled between a first node and a second node of the compensated polyphase network, and a second phase lag circuit coupled between a third node and a fourth node, wherein the first node is coupled to the second node via a first inductor and a first resistor, the second node is coupled to the third node via a second inductor and a first resistor, the third node is coupled to the fourth node via a third inductor and a third resistor, and the fourth node is coupled to the first node via a fourth inductor and a fourth resistor.

19. A method for performing polyphase filtering via a capacitor compensated polyphase filter circuit, comprising:
processing a radio frequency signal in a signal processing chain via an in-phase path configured to provide a plurality of in-phase signals and a quadrature path configured to provide a plurality of quadrature signals;
processing a differential input signal; and
generating, via a quadrature signal generator, a first differential output signal for the plurality of in-phase signals and a second differential output signal for the plurality of quadrature signals, by providing a capacitive compensation mechanism at internal nodes of the capacitor compensated polyphase filter circuit and with a first stage that includes a first inductor high pass filter coupled to a first inductor low pass filter, and a second stage that includes a second inductor high pass filter coupled to a second inductor low pass filter.

20. The method of claim 19, further comprising:
generating an inductive load at first output terminals of the first differential output signal and at second output terminals of the second differential output signal.

21. The method of claim 19, further comprising:
driving, via the differential input signal at a first input of a differential input, the capacitor compensated polyphase filter circuit at a first node of the internal nodes by a first capacitor coupled to the first input, and at a second node tapped at the first input; and
driving, via the differential input signal at a second input of the differential input, the capacitor compensated polyphase filter circuit at a third internal node of the internal nodes by a second capacitor coupled to the second input, and at a fourth node tapped to the second input.

* * * * *